United States Patent
Arnborg

(10) Patent No.: US 7,330,077 B2
(45) Date of Patent: Feb. 12, 2008

(54) MONOLITHICALLY INTEGRATED POWER AMPLIFIER DEVICE

(75) Inventor: Torkel Arnborg, Stockholm (SE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/605,211

(22) Filed: Nov. 28, 2006

(65) Prior Publication Data

US 2007/0146079 A1 Jun. 28, 2007

Related U.S. Application Data

(63) Continuation of application No. PCT/EP2006/000738, filed on Jan. 27, 2006.

(30) Foreign Application Priority Data

Feb. 28, 2005 (SE) .................................. 0500452

(51) Int. Cl.
 H03F 3/14 (2006.01)
 H03F 3/68 (2006.01)
(52) U.S. Cl. .................. 330/307; 330/295; 330/136
(58) Field of Classification Search ............... 330/307, 330/136
 See application file for complete search history.

(56) References Cited

U.S. PATENT DOCUMENTS

| 5,757,229 | A | * | 5/1998 | Mitzlaff | 330/124 R |
| 6,242,985 | B1 | | 6/2001 | Shinomiya | 330/295 |
| 6,522,203 | B1 | * | 2/2003 | Tiren et al. | 330/295 |

FOREIGN PATENT DOCUMENTS

| EP | 0 372 984 A2 | 12/1990 |
| EP | 0 630 104 A2 | 12/1994 |
| WO | WO 01/24271 A1 | 4/2001 |
| WO | WO 02/25810 A2 | 3/2002 |

OTHER PUBLICATIONS

Chung, Younkyu et al. "Efficiency-Enhancing Technique: LDMOS Power Amplifier Using Dual-Mode Operation Design Approach," IEEE MIT-S Digest, pp. 859-862, 2004. (4 Pages).
Cho, Kyoung-Joon et al. "A Highly Efficient Doherty Feedforward Linear Power Amplifier for W-CDMA Base-Station Applications," IEEE Trans on Microwave Theory and Techniques, vol. 53, No. 1, pp. 292-300, Jan. 2005. (9 Pages).
Cripps, Steven C. "RF Power Amplifiers for Wireless Communications." Artech House Publishers, 1999. pp. 225-293. (15 Pages).
Cripps, Steven C. "Advanced Techniques in RF Power Amplifier Design." Artech House Publishers, 2002. pp. 33-57. (25 Pages).

* cited by examiner

Primary Examiner—Steven J. Mottola
(74) Attorney, Agent, or Firm—Maginot, Moore & Beck

(57) ABSTRACT

A monolithically integrated microwave frequency high power amplifier device comprises a plurality of transistors connected in a load modulation configuration wherein the number of the transistors that is operational depends on the drive level. The transistors have each a finger type layout, where fingers from different ones of the transistors are interleaved. The sources of the plurality of transistors are typically interconnected, whereas the gates of the transistors have separate connections for connection to separate package leads. Similarly, the drains of the transistors have separate connections for connection to separate package leads. Advantageously, an LC-based passive network performs a power combining operation of the amplifier device.

20 Claims, 4 Drawing Sheets

MONOLITHICALLY INTEGRATED POWER AMPLIFIER DEVICE

CROSS-REFERENCE TO RELATED APPLICATION

This application is a continuation of copending International Application No. PCT/EP2006/000738, filed Jan. 27, 2006, which designated the United States.

BACKGROUND

The present invention generally relates to the field of integrated circuit technology, and more specifically the invention relates to a monolithically integrated microwave frequency high power amplifier device.

Power amplifiers for many new modulation techniques, especially those applied in 3G base stations like CDMA and multi-carrier techniques, require high linearity together with reasonable power efficiency. A very common approach is to use feed forward power amplifiers, an example of which being illustrated in FIG. 1. The bias network is simplified using large inductors for DC feed and large capacitors for DC block.

To achieve high power it is practical to form a transmitter from some kind hierarchical elements such as transistor fingers, cells, packages or amplifiers that can be used together by adding power from each of the elements at one level to an element at next level.

Two methods are frequently used today: parallel coupling and power combining.

The simplest method is to just connect the elements in parallel using low resistance wires. This works fine as long as the current distribution is uniform. Unfortunately this is not always the case due to manufacturing process variations, asymmetries in the design, or failure of single elements.

The more sophisticated way, to use power combining, is very robust and allows all these kinds of variations and failures without resulting in a total breakdown of the transmitter. Power combiners must be used in many cases because there are no other alternatives.

In research laboratories many new implementations of old concepts like Doherty, Chireix and Kahn have been tested. A schematic of the classic Doherty amplifier is illustrated in FIG. 2.

The main problem with feed forward and switching techniques is the low power efficiency.

The Doherty, Chireix and Kahn amplifiers fulfill the desired specifications but are very difficult to realize with the spread typically occurring in electrical parameter data.

Further, they all rely on power combiners, which is not particularly area efficient.

Thus, it would be advantageous to provide an integrated microwave frequency high power amplifier device that has high linearity and high power efficiency, that occupies less area than a prior art power amplifier, and/or that can be fabricated in any MOS process without the need of additional processing steps.

BRIEF SUMMARY

In at least one embodiment, a monolithically integrated microwave frequency high power amplifier device of the present invention comprises at least two transistors connected in a load modulation or Doherty configuration wherein the number of transistors that is operational depends on the drive level. The transistors have each a finger type layout, wherein fingers from different ones of the transistors are interleaved.

Advantageously, the sources of the transistors are interconnected, whereas the gates and the drains of the transistors have separate connections for connection to separate package leads.

An LC-based passive network formed integrally with the amplifier device performs advantageously the power combining operation locally at the chip finger level, where process variations and asymmetries are negligible.

Hereby, a fully integrated microwave frequency power amplifier device having an in-package formed power combining device is obtained. The device occupies much smaller area than circuit board solutions of the prior art.

Additional characteristics and advantages will be evident from the detailed description of the embodiments given hereinafter and the accompanying FIGS. 1-11, which are given by way of illustration only and thus, are not limitative.

DETAILED DESCRIPTION

Figure 1:
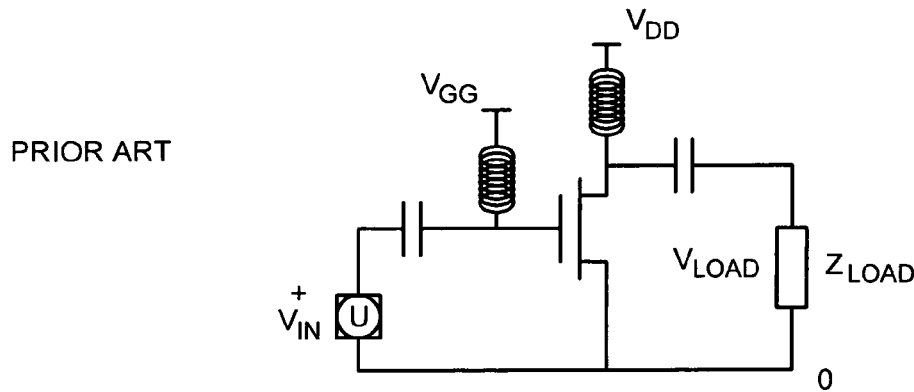
FIGS. 1 and 2 illustrate schematically prior art amplifier devices.
Figure 2:
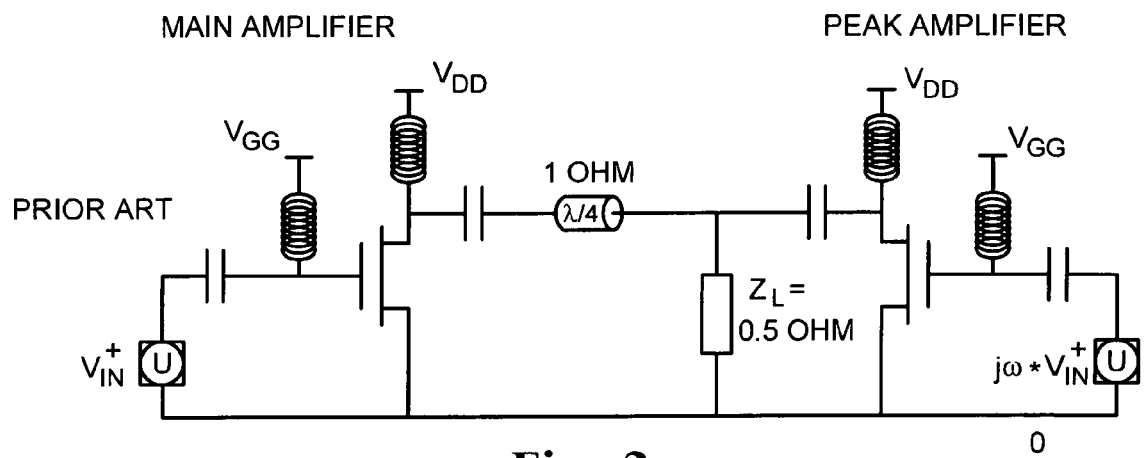
Figure 3:
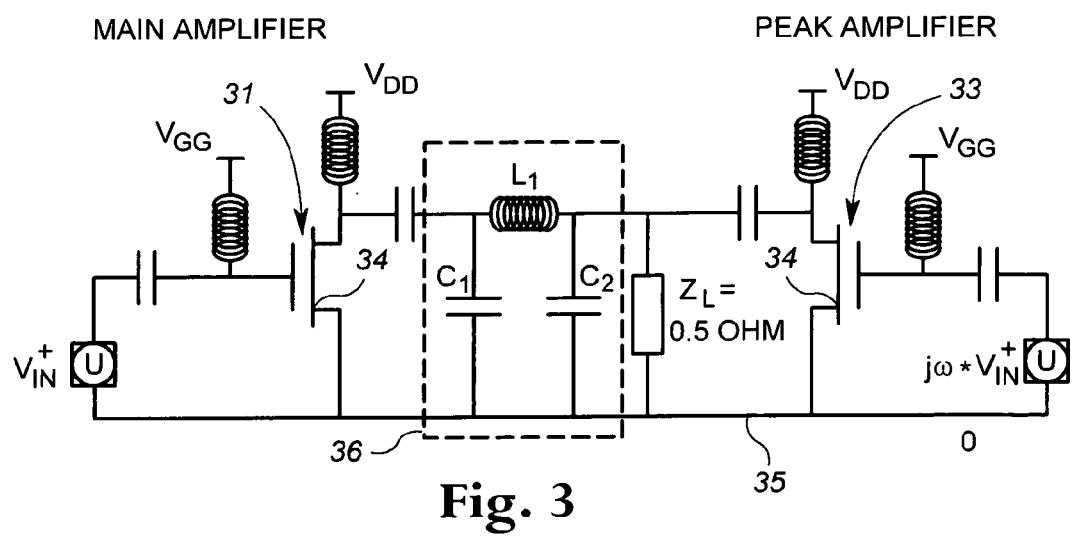
FIG. 3 illustrates schematically a monolithically integrated power amplifier device according to an embodiment of the present invention.

In FIG. 3 a monolithically integrated microwave frequency high power amplifier device according to an embodiment of the present invention is schematically illustrated.

The power amplifier device comprises two transistors 31, 33 connected in a load modulation or Doherty configuration. The left part is denoted a main amplifier, and the right part is denoted a peak amplifier. A characteristic of the Doherty amplifier is that for low input power the peak amplifier is disconnected, letting the main amplifier perform the amplification. When the main amplifier starts to compress, the peak amplifier is gradually turned on. Finally, at maximum input power, both amplifiers are connected in parallel contributing equal to the power amplification.

In the analogue circuit implementation, the control of power delivery is taken care of automatically by a smart design of the circuits. Two important ingredients are used: the load pull action and the class C bias of the peak amplifier. In the literature the Doherty amplifier has been analyzed for only special cases: at low input power when the main amplifier only is operational and at maximum input power when main and peak amplifiers contribute equal to the amplification. The more complicated mode of operation, when the peak amplifier is assisting the main amplifier, can only be studied using experiments and simulations.

The operation of the classic Doherty amplifier has been described in detail in the literature, see Steven Cribbs, "RF Power Amplifiers for Wireless Communication", Artech House Publishers, 1999, and Steven Cribbs, "Advanced Techniques in RF Power Amplifier Design", Artech House Publishers, 2002.

For a classic Doherty amplifier designed for a drain voltage $V_{DD}$ of 28V, and a maximum current of about 15 mA, the load must be transformed by the quarter wave length transformer to half the characteristic impedance. A solution is a characteristic impedance $Z_0$ of 1 ohm and a load $Z_L$ of 0.5 ohm. This would give $Z_0*Z_0/Z_L=2$ ohms for low power operation as in a conventional amplifier and twice this value or 4 ohms for each amplifier taking the load pull of the other into account at maximum input power.

The main and peak amplifiers of the power amplifier device of FIG. 3 are, in accordance with the invention, connected via an integrally formed passive network 36, instead of the quarter wave ($\lambda/4$) length transformer as being used in the classic Doherty amplifier. The passive network is a lumped element solution comprising two shunt capacitors $C_1$, $C_2$ and one serially connected inductor $L_1$. The capacitance and inductance values are calculated from $$\omega C Z_0 = 1 \text{ and } \omega L = Z_0$$

where $Z_0$ is a characteristic impedance and $\omega/2\pi$ is the operational microwave frequency.

By the formation of a passive network on-chip as the power combining device, an area efficient packaged transistor, which avoids the additional space needed for separate power combiners in PCB-based amplifier solutions, is achieved.

The sources of the transistors 31, 33, denoted by 34 in FIG. 3 are typically short-circuited, schematically indicated at 35.

Figure 4:
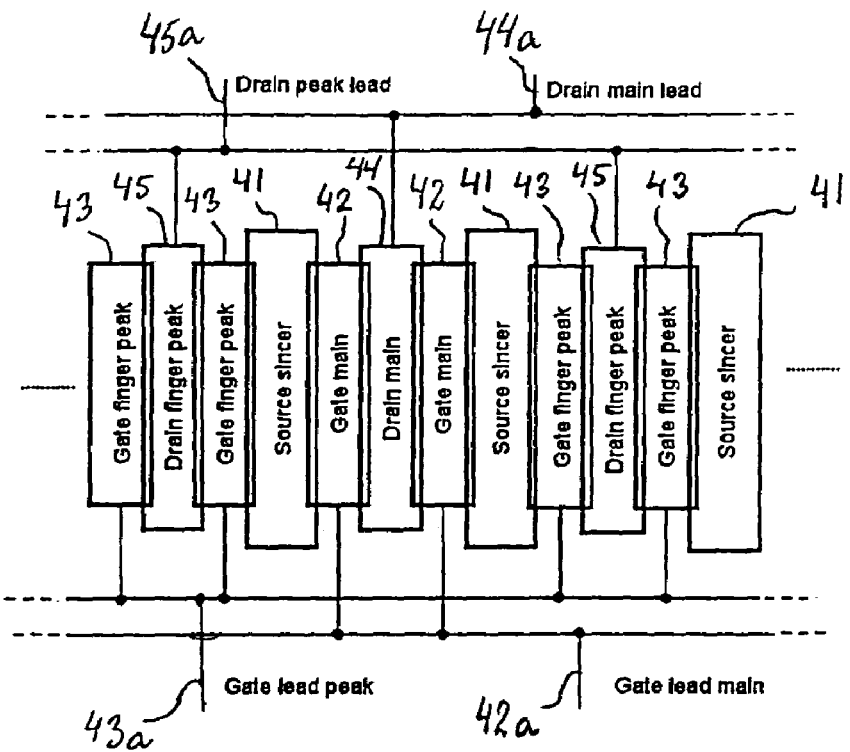
FIG. 4 is a schematic layout of an LDMOS transistor structure as comprised in the power amplifier device of FIG. 1.

The transistors 31, 33 of the inventive amplifier device are implemented as an LDMOS transistor structure in a finger type layout as being illustrated in FIG. 4. Note that only a portion of transistor structure is shown in FIG. 4. The Fingers 41-45 from different ones of the transistors 31, 33 are interleaved.

The combining of the microwave frequency power of the transistors is arranged to take place locally at the chip finger level, where the process variations and asymmetries are negligible.

The gate fingers 42, 43 of the transistors have separate connections 42a, 43a for connection to separate package leads. Similarly, the drains fingers 44, 45 of the transistors have separate connections 44a, 45a for connection to separate package leads. The separate gate and drain connections are typically formed at an upper side of the integrated structure, whereas the sources or source sinkers 41 of the transistors are connected at a lower side of the integrated structure.

Each of the transistors comprises multiple interconnected drain fingers 44, 45, and each of the drain fingers 44, 45 are surrounded, at opposite sides, by gate fingers 42, 43 advantageously belonging to the same transistor as the drain finger. Each two adjacent groups of gate fingers 42, 43 arranged on opposite sides of a drain finger 44, 45 are separated by a source sinker region 41, which is shared by the two transistors.

Advantageously, the groups of gate fingers 42, 43 arranged on opposite sides of a drain finger 44, 45 belong alternately to different ones of the transistors.

It shall however be appreciated that the interleaved transistor structure may be formed in a plurality of other manners known to a person skilled in the art. However, the structure requires two separate gate connections, two separate drain connections, and one common source connection in case the number of transistors used for amplification in the amplifier device is two.

However, the number of transistors may be more than two. In a general case of N transistors in the amplifier device, the transistor structure require N transistors, N separate gate connections, N separate drain connections, and one common source connection. N−1 power combiners in the form of passive LC networks are required to combine the output from the transistors. All transistors and passive LC networks are formed integrally on a single chip.

The fingers of all the transistors may be interleaved, or only fingers from transistors in a group are interleaved.

In case N transistors are connected with N bond wires used as the inductors in the passive power combining networks, the capacitance of each of the shunt capacitors is $C=1/N\omega Z_0$, and the inductance of each of the serially connected inductor is $L=Z_0 N/\omega$.

As a non-limiting example the following figures may be presented. Given a drain voltage of 28 V, a total drain width of 85 mm, a frequency $f=\omega/2\pi$ of 1 GHz, $Z_0=1$ ohm, $Z_L=0.5$ ohm, and a number N=1 of bond wires, each capacitor should have a capacitance value of about 80 pF and each inductor should have an inductance value of about 80 pH. If N=10, each capacitor in each power combining network should have a capacitance value of about 8 pF and each inductor should have an inductance value of about 800 pH.

Further, it shall be appreciated that the transistors of the amplifier device may have different numbers of fingers and different total widths.

The invention has been verified using microwave circuit simulation. The transistor chosen is of LDMOS type. Any internal matching network has been removed in each of the amplifiers since it has been used for the Doherty power combining.

Figure 5:
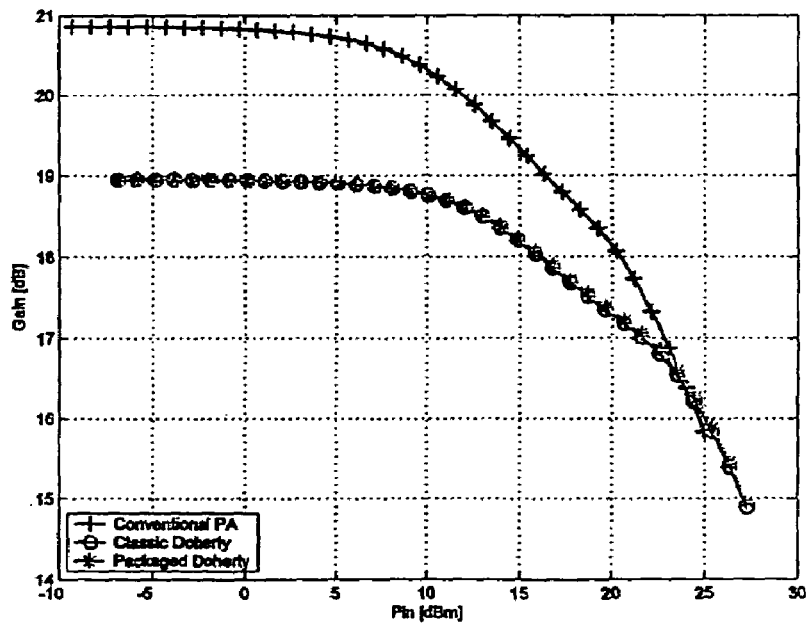
FIGS. 5-11 are diagrams illustrating various simulated transistor characteristics of the power amplifier device of FIG. 1 as compared to prior art devices.
Figure 6:
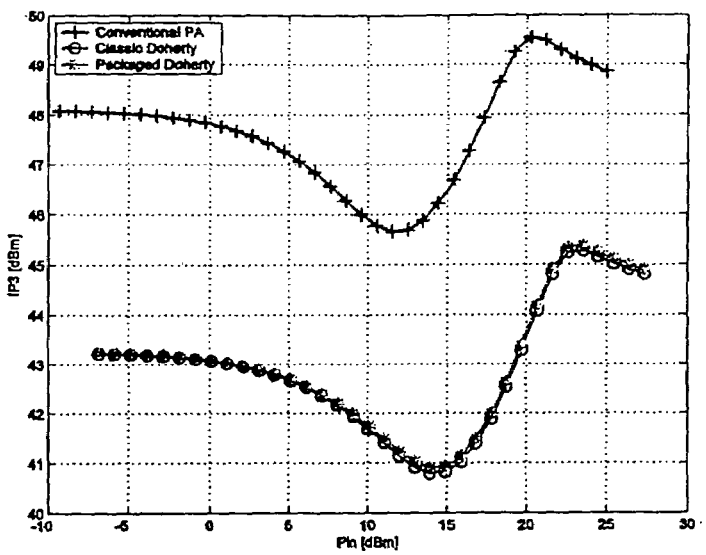
Figure 7:
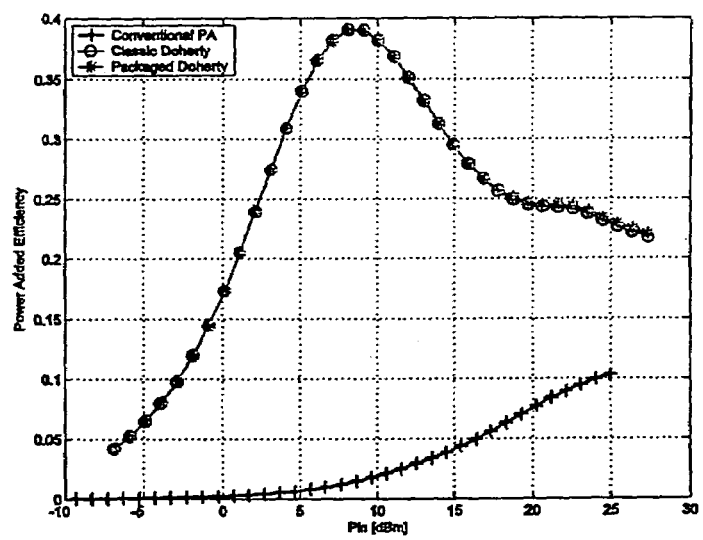

Simulation results in FIGS. 5-7 compare the conventional amplifier, the classic Doherty amplifier and the inventive packaged Doherty amplifier. The figures of merit are gain, 3rd order intercept point, IP3, and power added efficiency.

FIG. 5 shows gain versus input power. The input power is in general determined by matching networks. In this case the input is driven directly from a voltage generator and the power is calculated as the voltage current product. The Doherty amplifiers have a contribution from the idle peak amplifiers that reduce the gain compared to the conventional one. The gain reduction due to compression is partially prevented in the Doherty amplifiers. The difference between the inventive packaged Doherty amplifier and the classic Doherty amplifier is small not only for the gain but for also for the other figures of merit. The reason is that the lumped element CLC-network for the first carrier and the two-tone excitation case studied here is a good approximation of a quarter wave-length transformer.

FIG. 6 shows IP3 versus input power. A general similar behavior is found for all three amplifiers. However, looking at the magnitudes the curves are only similar at lower input power. At higher input power the curves show differences in the favor of the inventive and conventional Doherty amplifiers. This is due to the peak amplifiers becoming active.

FIG. 7 shows output power versus input power. A drastic difference in power efficiency between the conventional amplifier, on one hand, and the inventive and conventional Doherty amplifiers, on the other hand, is notable. The conventional amplifier shows efficiency in a percent range, whereas the inventive and conventional Doherty amplifiers Doherty show efficiencies in some tenths of percent. The peak value for the conventional amplifier is 10% and for the inventive and conventional Doherty amplifiers 40%.

Figure 8:
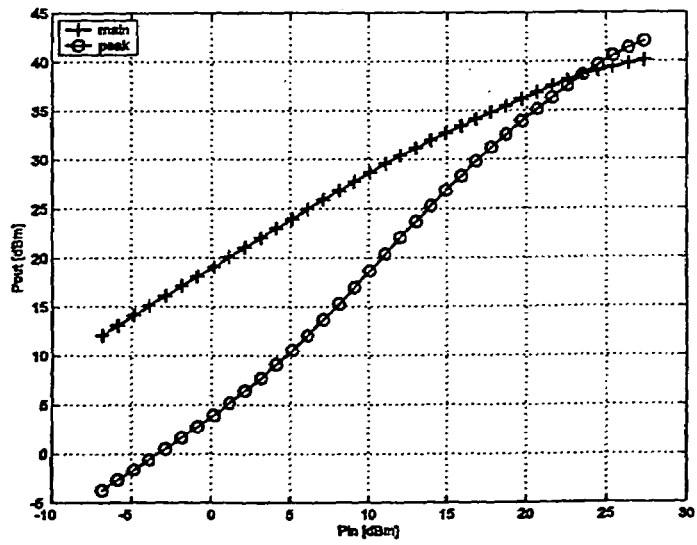

FIG. 8 shows output power versus input power for the main and peak amplifiers of the inventive Doherty amplifier device. It is noted that the peak amplifier is gradually delivering more power and finally at the maximum input power, the peak amplifier contributes with equal amount as the main amplifier.

Figure 9:
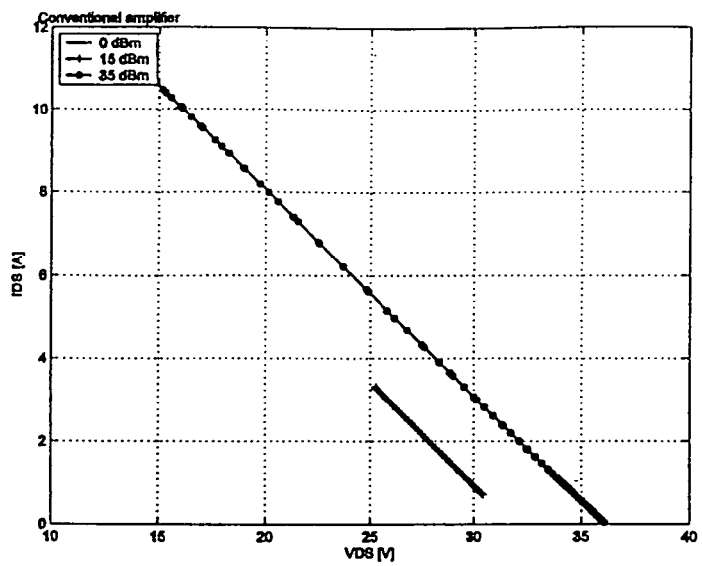
Figure 10:
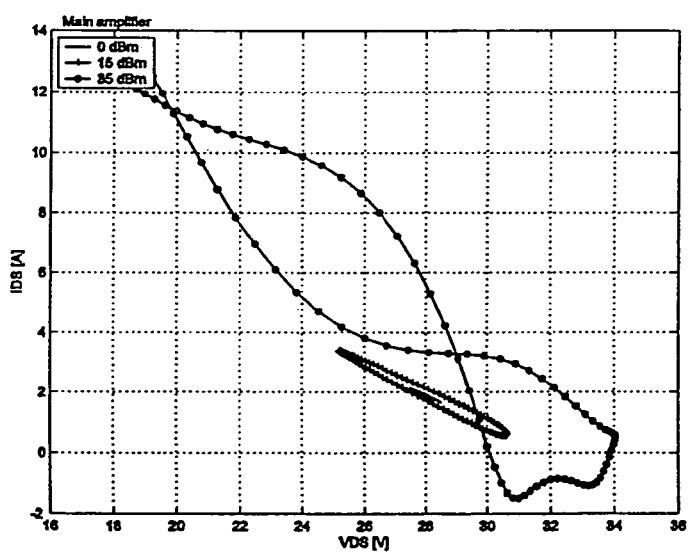
Figure 11:
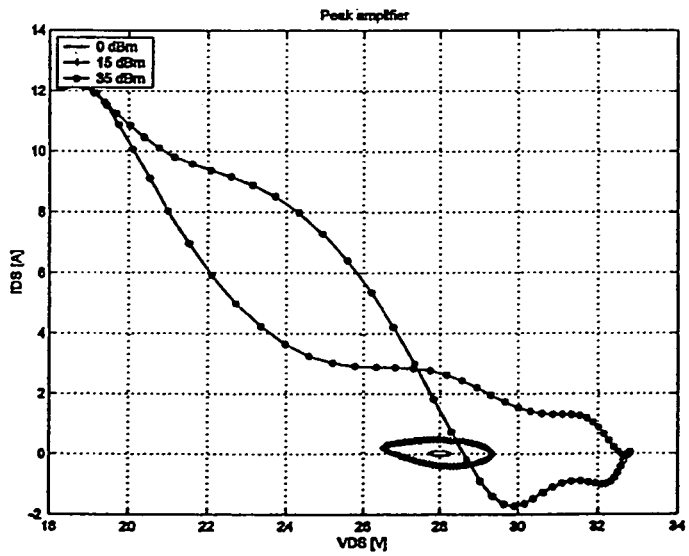

FIGS. 9-11 shows load lines, i.e. drain-source current versus drain-source voltage, at three different input powers (0 dBm, 15 dBm, and 35 dBm) for the conventional amplifier (FIG. 9), for the main amplifier of the inventive Doherty amplifier device (FIG. 10), and for the peak amplifier of the inventive Doherty amplifier device (FIG. 11). The high power load line may be regarded as having an unusual behavior due to the LC elements present. However, a change in the average slope for the different power levels can be noted due to the Doherty load-pull phenomenon.

It is obvious from this simulation study that the inventive packaged Doherty amplifier device behaves like the classic Doherty amplifier and will give much better power efficiency than what is achievable by today's devices. Concurrently, no additional board space for transmission line power combining is needed.

An additional conclusion is also that a more dense utilization of microwave frequency power transistors as being provided by the present invention is advantageous since for the same device area the power added efficiency can be increased substantially.

While this invention has been described in terms of several preferred embodiments, there are alterations, permutations, and equivalents, which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A monolithically integrated microwave frequency high power amplifier device, comprising:
    a plurality of transistors connected in a load modulation configuration wherein the number of said plurality of transistors that is operational depends on the drive level, wherein
    said plurality of transistors each comprises a finger type layout, wherein fingers from different ones of said plurality of transistors are interleaved.

2. The amplifier device of claim 1, wherein
    the sources of said plurality of transistors are interconnected, and
    the gates of said plurality of transistors comprise separate connections for connection to separate package leads.

3. The amplifier device of claim 2, wherein the drains of said plurality of transistors comprise separate connections for connection to separate package leads.

4. The amplifier device of claim 1, wherein each of the drains of said plurality of transistors comprises a plurality of interconnected drain fingers.

5. The amplifier device of claim 4, wherein gate fingers are arranged on opposite sides of each of the drain fingers.

6. The amplifier device of claim 1, wherein each two adjacent groups of gate fingers arranged on opposite sides of a drain finger are separated by a source region.

7. The amplifier device of claim 1, wherein said plurality of transistors are connected to each other via a power combining arrangement.

8. The amplifier device of claim 7, wherein said power combining arrangement comprises a passive network.

9. The amplifier device of claim 7, wherein said power combining arrangement comprises a CLC network.

10. The amplifier device of claim 9, wherein said CLC network comprises two shunt capacitors and one serially connected inductor for each but one of said plurality of transistors.

11. The amplifier device of claim 10, wherein the capacitance of each of said shunt capacitors is $C=1/(N\omega Z_0)$, and the inductance of each of said serially connected inductor is $L=Z_0 N/\omega$, where $Z_0$ is a characteristic impedance, $\omega/2\pi$ is an operational microwave frequency, and N is the number of said plurality of transistors.

12. The amplifier device of claim 1, wherein the number of said plurality of transistors is two.

13. The amplifier device of claim 1, wherein the number of said plurality of transistors is higher than two.

14. The amplifier device of claim 1, wherein said amplifier device is a Doherty amplifier.

15. The amplifier device of claim 1, wherein at least two of said plurality of transistors comprise different widths.

16. A monolithically integrated microwave frequency high power amplifier device, comprising:
    a plurality of transistors connected in a load modulation configuration wherein the number of said plurality of transistors that is operational depends on the drive level;
    wherein each transistor of the plurality includes a plurality of drain fingers and a plurality of gate fingers, the plurality of drain fingers and gate fingers of each transistor being arranged in finger groups, each finger group comprising a drain finger interleaved between a pair of gate fingers; and
    wherein the finger groups of the plurality of transistors are arranged such that a finger group of a first transistor of the plurality is interleaved between two finger groups of other transistors of the plurality, the interleaved finger groups being separated by a source region.

17. The amplifier device of claim 16, wherein each transistor of the plurality has a common source connection and separate gate and drain connections, the separate gate and drain connections for connection to separate package leads.

18. The amplifier device of claim 16, wherein said plurality of transistors are connected to each other via a power combining arrangement.

19. The amplifier device of claim 16, wherein the number of transistors is two.

20. A monolithically integrated microwave frequency high power amplifier device, comprising:
    a first transistor and a second transistor connected by a CLC network including two shunt capacitors and one serially connected inductor;
    wherein the first and second transistors each include a plurality of drain fingers and a plurality of gate fingers, the plurality of drain fingers and gate fingers of each transistor being arranged in finger groups, each finger group comprising a drain finger interleaved between a pair of gate fingers; and
    wherein the finger groups of the first and second transistors are arranged such that the finger groups of the first transistor are interleaved between the finger groups of the second transistor, the interleaved finger groups being separated by a source region.

* * * * *